United States Patent [19]

Colom et al.

[11] 3,773,670

[45] Nov. 20, 1973

[54] NOVEL ETCHANT FOR ETCHING THIN METAL FILMS

[75] Inventors: Lucas A. Colom, Bloomingburg; Harold A. Levine, Poughkeepsie, both of N.Y.

[73] Assignee: International Business Machines Corporation, Armonk, N.Y.

[22] Filed: Sept. 14, 1971

[21] Appl. No.: 180,487

Related U.S. Application Data

[62] Division of Ser. No. 837,571, June 30, 1969, Pat. No. 3,639,185.

[52] U.S. Cl. .................................. 252/79.5, 156/18
[51] Int. Cl. .......................... C23q 1/20, C23f 1/02
[58] Field of Search ...................... 252/79.5; 156/18, 156/22, 13; 96/36.2

[56] References Cited

UNITED STATES PATENTS

| | | | |
|---|---|---|---|
| 2,931,713 | 4/1960 | Newhard et al. | 156/22 |
| 3,098,043 | 7/1963 | Wendell | 252/79.5 |
| 3,639,185 | 2/1972 | Colom et al. | 252/79.5 X |

*Primary Examiner*—Jacob H. Steinberg
*Attorney*—Julius B. Kraft et al.

[57] ABSTRACT

A composition for etching thin films of metal, such as chromium or molybdenum, comprising alkaline metal salts of weak organic acids which yield solutions having a pH in the range of 12 to 13.5 e.g. sodium or potassium-meta or orthosilicates or sodium orthophosphate, and oxidizing agents active in alkaline solutions, such as potassium permanganate or sodium ferricyanide.

4 Claims, 5 Drawing Figures

INVENTORS
LUCAS A. COLOM
HAROLD A. LEVINE

BY J. B. Kraft
ATTORNEY

NOVEL ETCHANT FOR ETCHING THIN METAL FILMS

This is a division of application Ser. No. 837,571, filed June 30, 1969.

BACKGROUND OF THE INVENTION

1. Field of the Invention

The present invention relates to the fabrication of microelectronic semiconductor devices and integrated circuits, and is particularly directed to the making of masks utilizable in such semiconductor fabrication.

2. Description of the Prior Art

The semiconductor device art has been continuously miniaturizing its components and circuits in order to achieve low-cost and durable units capable of performing electronic functions at very high speeds. These elements are fabricated in large numbers simultaneously. Up to a thousand integrated circuits can be fabricated simultaneously in a silicon wafer which is about 1 inch in diameter and less than 1/100 inch in thickness. In these simultaneous fabrication approaches, it is necessary to perform various fabrication processes such as impurity diffusion, epitaxial growth and metallization in minute, selected areas over the entire wafer without affecting the remaining areas of the wafer. In order to define the minute areas in which a particular fabrication step is to be performed, photosensitive polymeric coatings or photoresists are coated over the entire wafer and exposed to a mercury arc light through a contacting optical mask to produce an exposure pattern, after which the minute areas which are to be processed in the given fabrication step are uncovered by selectively removing photoresists. At least one individual optical mask is required for each step in semiconductor fabrication. Such masks are usually opaque, metallic film patterns on a transparent glass plate. The metallic film pattern is usually formed by etching with a suitable etchant through a photoresist pattern. However, with the increasing density of devices in integrated circuits, increasingly higher resolution and edge definition is required in the metallic mask patterns. For the fabrication of such advanced integrated circuits, optical masks are required which have lines in the order of 500 microinches (½ mil) with edge definition in the order of 10 microinches (1/100 mil.)

Difficulties have been experienced in obtaining such parameters with the negative working photoresists usually used in semiconductor fabrication. Such negative photoresists yielded ragged line edges which are not satisfactory. On the other hand, while the less widely used positive photoresists do not present edge definition problems, such photoresists are less than satisfactory because they are alkali-developable and consequently, are attacked by the standard alkali etches, formulated with sodium and potassium hydroxide, used for forming the metallic film patterns in the masks.

Essentially all of the standard positive photoresist materials available in the semiconductor fabrication art are alkaline-developable and of the phenol-formaldehyde/quinone-diazide sulfonic acid ester sensitizer type. Examples of such positive photoresist systems may be found in U.S. Pat. No. 3,201,239 describing mixtures of such phenol-formaldehyde resins and sulfonic acid esters and U.S. Pat. No. 3,046,120 describing the condensation reaction products of such sulfonic acids and phenol-formaldehyde resins.

Attempts have been made to render positive photoresist patterns resistant to the alkali etchants to be used on the metallic film by post-baking the developed photoresist. However, the minimum post-bake necessary to render the photoresist resistant to the alkali etch is at least 30 minutes at at least 180° C. At either a lower temperature or a lower time period, the photoresist is attacked by the etchant. This etchant is conventionally an oxidizing agent in a medium of sodium or potassium hydroxide solution. The required severe post-bake has two serious disadvantages. First, it renders it extremely difficult to maintain the dimensions of the patterns within tolerances in the order of 1/100 mil. More significantly, the photoresist becomes very difficult, if not impossible, to completely remove. Also, it is brittle and prone to thermal cracking of the image. Incomplete removal of the photoresist makes the mask inoperable.

SUMMARY OF THE INVENTION

Accordingly, it is an object of this invention to provide a process for etching thin films of metal through photoresists, particularly positive photoresists, without affecting the photoresists.

It is a further object of this invention to provide a novel etching composition for films of metal which does not attack such photoresists.

It is a further object of this invention to provide a method of etching thin films of metal with such novel etching compositions.

It is still another object of this invention to provide a method for simultaneously developing a positive photoresist and etching a metallic film covered by such a photoresist.

It is an even further object of this invention to provide a method for the fabrication of optical masks having high resolutions, edge definitions and dimensional fidelity.

It is yet a further object of the present invention to provide a method for etching Group VIA metals such as chromium and molybdenum.

It is a still further object of this invention to provide a method for etching such Group VIA metals selectively through a positive alkaline-developed photoresist.

The present invention accomplishes these objects by a method of etching thin films of metals utilizing a novel etching composition comprising an aqueous solution of at least one salt of a weak inorganic acid and strong base such as an alkaline metal salt of a weak inorganic acid. The dissociation constant of the salt should be such that a five percent aqueous solution of the salt has a pH in the range of from 12 to 13.5, and an oxidizing agent which is active in alkaline solutions; the composition has a pH of from 12 to 13.5. This novel etching composition, unlike the previously described sodium and potassium hydroxide type etchants, will not attack positive photoresists which have been baked for time temperature cycles less than the 180°C/30 minutes cycle. In fact, the etching method of the present invention can be effectively used even without any post-bake of the developed photoresist. In forming an optical mask by the present method, photoresist is applied over the metallic film on the glass substrate. The photoresist is then exposed to the selected pattern and developed in the conventional manner. Then, the developed photoresist may be subjected to a less severe post-bake, for a temperature/time cycle preferably in the order of from 160° to 120° C. for from 5 to 60 minutes. Alternatively, there is no post-bake at all. The unprotected metal film is then etched using the previously described novel etching composition. The photoresist pattern is not attacked and is then readily removed by conventional positive photoresist stripping solutions.

In accordance with another aspect of this invention, a method is provided wherein the previously described, novel etching composition is used to simultaneously develop a previously exposed positive photoresist and to etch away the metal underlying the removed portions of photoresist.

The foregoing and other objects, features and advantages of the invention will be apparent from the following more particular description and preferred embodiments of the invention as illustrated in the accompanying drawing.

DESCRIPTION OF THE PREFERRED EMBODIMENTS

The following are illustrative examples of the preferred embodiments of the present invention:

EXAMPLE 1

Figure 1A:
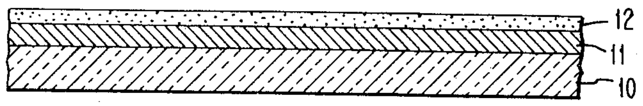
FIGS. 1A through D are diagrammatic, cross-sectional views showing the steps in the formation of a mask described in Example 1.

A transparent glass plate 10, FIG. 1A, is coated with a thin film of chromium 11, from 0.04 to 0.14 microns thick using conventional vapor or sputter depostion techniques. The chromium film is, in turn, coated with a layer 12 of alkali soluble, positive photoresist which is a photosensitive composition including a diazoketone sensitizer, the 4'-2'-3' dihydroxybenzophenone ester of 1-oxo-2-diazonaphthalene-5-sulfonic acid, and an m-cresol formaldehyde novolak resin of approximately 1,000 average molecular weight having the structure

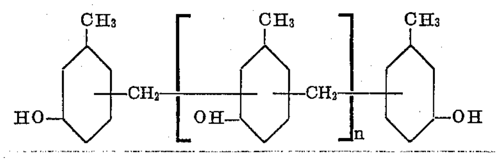

dissolved in a solvent consisting of 83 percent ethyl cellosolve acetate, 9 percent n-butylacetate and 8 percent xylene. The photoresist is dried at 75° C for 30 minutes to a thickness of from 0.35 to 0.67 microns.

Figure 1B:
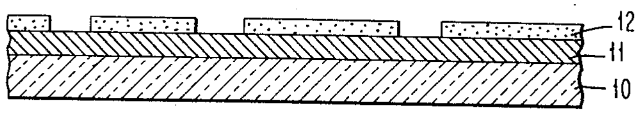
Figure 1C:
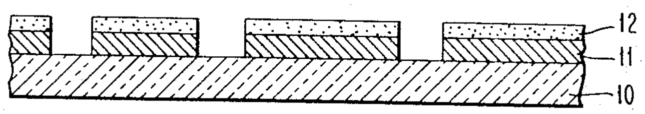
Figure 1D:
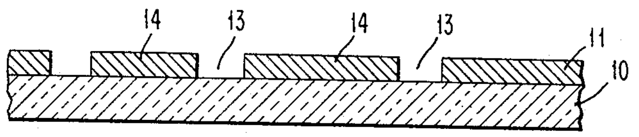

The resist layer is then exposed through a mask pattern to a 200 watt mercury lamp for 10 to 20 seconds by conventional contact or projection printing techniques. The photoresist is then developed in a conventional alkaline developer for positive photoresists, e.g. an aqueous solution of about 5 percent solids by weight comprising a mixture of meta-silicate and sodium phosphate, predominantly sodium ortho-phosphate, having a pH of 12.7 at room temperature to remove the photoresist in the areas exposed to light to produce the structure of FIG. 1B. This structure is then immersed in an etch bath consisting of 40g. to 60g. potassium permanganate dissolved in 1 liter of a 5.0 percent aqueous solution by weight of a mixture of sodium metasilicate and sodium phosphate, predominantly orthophosphate, for about 10 minutes. The chromium is cleanly removed from regions not covered by photoresist to produce the structure shown in FIG. 1C. The photoresist layer 12 is in no way affected and is then completely removed by a dip into methyl ethyl ketone to provide the chromium mask of FIG. 1D. The quality of chromium layer 11 edges bordering on openings 13 is excellent with no jagged edges, and the sizes of image lines 14 are well within tolerances in the order of less than 20 microinches.

This example may be repeated using molybdenum in place of chromium.

EXAMPLE 2

Example 1 is repeated, using the same procedure, conditions, compositions and proportions except that the etch bath has the following composition:

Potassium permanganate 40g.
Sodium meta-silicate 56.8g.
Water to provide 1 liter of solution. The resulting mask structure has all of the desirable properties of the mask of Example 1.

EXAMPLE 3

Example 1 is repeated, using the same procedure, conditions, compositions and proportions except that the etch bath has the following composition:

POtassium permanganate 60g.
Sodium meta-silicate 56.8g.
Water to provide 1 liter of solution.

The resulting mask structure has all of the desirable properties of the mask of Example 1.

EXAMPLE 4

Example 1 is repeated, using the same procedure, conditions, compositions and proportions except that the etch bath has the following composition:

Potassium permanganate 40g.
Sodium ortho-silicate 73g.
Water to provide 1 liter of solution.

The resulting mask structure has all of the desirable properties of the mask of Example 1.

EXAMPLE 5

Example 1 is repeated, using the same procedure, conditions, compositions and proportions except that the etch bath has the following composition:

a saturated solution of potassium ferricyanide, about 350g., in 1 liter of a 5.2 percent aqueous solution by weight of a mixture of sodium meta-silicate and sodium orthophosphate.

The resulting mask structure has all of the desirable properties of the mask of Example 1.

EXAMPLE 6

Example 1 is repeated, using the same procedure, conditions, compositions and proportions except that the structure is subjected to a second heating step at 160° C. for 5 minutes in a nitrogen atmosphere subsequent to development but prior to etching.

The resulting mask structure has all of the desirable properties of the mask of Example 1. This example may be repeated, using molybdenum in place of chromium.

EXAMPLE 7

Example 1 is repeated, using the same procedure, conditions, compositions and proportions except that the structure is subjected to a second heating step at 140° C. for 30 minutes in a nitrogen atmosphere subsequent to development but prior to etching.

The resulting mask structure has all of the desirable properties of the mask of Example 1.

EXAMPLE 8

Following the second heating step or post-bake procedure set forth in Examples 7 and 8, desirable properties may be achieved by using the following time/temperature cycles:

LIMITS

| | From | To |
|---|---|---|
| 120°C | 20 min. | 60 min. |
| 130°C | 15 min. | 45 min. |
| 150°C | 10 min. | 30 min. |
| 160°C | 5 min. | 15 min. |

Figure 2:
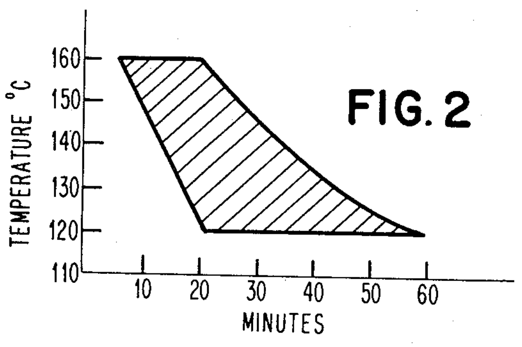
FIG. 2 is a graph showing optimum time/temperature post-bake conditions.

This data is plotted in the graph of FIG. 2. The hatch area of the graph covers the preferred time/temperature combinations. The primary advantage of the preferred post-bake cycles is that greater tolerances in the subsequent etch time become possible without any significant effects on chromium image quality, or line size. Above 160° C, the previously described disadvantages of severe post-bake are manifested, while post-bakes below 120° C. produce no substantial differences over the non-post-bake procedure.

EXAMPLE 9 (Prior Art-Control)

Examples 1, 6 and 7 are each respectively repeated, using the same conditions, compositions, procedure and proportions except that the etch bath is a prior art etch having the following composition:

Potassium permanganate 40g.
Sodium Hydroxide 27g.
Water to provide 1 liter of solution.

In each of the three cases, the etch bath attacks and deteriorates the photoresist so badly that selective etching is substantially impossible.

EXAMPLE 10

A transparent glass plate 10, FIG. 1A, is coated with a thin film of chromium 11, from 0.04 to 0.14 microns thick, using conventional vapor deposition techniques. The chromium film is, in turn, coated with a layer 12 of alkali soluble positive photoresist which is a photosensitive composition including a diazo ketone sensitizer, the 4'-2'-3'-dihydroxybenzophenone ester of 1-oxo-2-diazonaphthalene-5-sulfonic acid and an m-cresol formaldehyde novolak resin of approximately 1,000 molecular weight having the structure

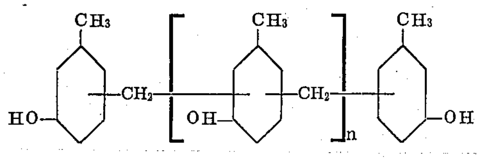

dissolved in a solvent consisting of 83 percent ethyl cellosolve acetate, 9 percent n-butylacetate and 8 percent xylene. The photoresist is dried at 75° C. for 15 minutes to a thickness of 0.67 microns. The plate is then exposed through a contacting mask pattern to a 200 watt mercury lamp for 10 or more seconds. The structure is then immersed for 12 minutes at room temperature in an aqueous 12.5 pH solution of:

Potassium permanganate 40g.
Mixture of approximately equal parts of sodium meta-silicate and sodium ortho-phosphate 52g.
Water to provide 1 liter of solution.

The solution removes both the exposed areas of photoresist and the underlying chromium layer to provide a mask structure having all of the desirable properties of the mask of Example 1. This example may be repeated, using molybdenum in place of chromium.

EXAMPLE 11

A transparent glass plate 10, FIG. 1A, is coated with a thin film of chromium 11, about 0.04 to 0.14 microns thick, using conventional vapor deposition techniques. The chromium film is, in turn, coated with a layer 12 of alkali soluble positive photoresist which is a photosensitive composition including a diazo ketone sensitizer, the 4'-2'-3'-dihydroxybenzophenone ester of 1-oxo-2-diazonaphthalene-5-sulfonic acid and an m-cresol formaldehyde novolak resin of approximately 1,000 molecular weight having the structure

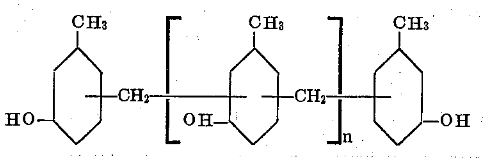

dissolved in a solvent consisting of 83 percent ethyl cellosolve acetate, 9 percent n-butylacetate and 8 percent xylene. The photoresist is dried at 75° C. for 15 minutes to a thickness of 0.67 microns. The plate is then exposed through a contacting mask pattern to a 200 watt mercury lamp for 10 or more seconds. THe photoresist is then developed in a conventional alkaline developer for positive photoresists, e.g. an aqueous solution of about 2.6 percent solids by weight comprising a mixture of sodium meta-silicate and sodium ortho-phosphate having a pH of 12.7 at room temperature to remove the photoresist in the areas exposed to light to produce the structure of FIG. 1B. The developed structure is then heated at 140° C. for 30 minutes in an inert atmosphere, after which, it is immersed in an aqueous solution of:

Potassium ferricyanide 200g.
Sodium meta-silicate 53g.
Water to provide 1 liter of solution
Sulfuric acid to bring pH down to 13.1

The resulting mask structure has all of the desirable properties of the structure of Example 1.

With respect to the alkaline metal salts used in the present invention, a 5 percent aqueous solution (50 q. per liter) of such salts must have a pH in the range of 12 to 13.5. The pH is measured using the 0–14 standardized glass electrode calibrated with respect to a standard 10 pH buffered solution. The pH of the 5 percent solution is measured in composition medium, that is in the presence of the oxidizing agent. It should be understood that by the selection of a 5 percent solution, there is no intent to limit the compositions of this invention to only 5 percent salt solution. The 5 percent solution is used primarily as a test to determine whether a given salt is suitable. For example, with certain alkali metal salts of weak acids, 5 percent solutions of which fall into this pH range, solutions up to 15 percent and higher would provide etching compositions with pH's of less than 13.5.

Sodium and potassium salts of weak acids have been found to be effective in meeting the required pH range, particularly silicate salts, such as ortho and meta-silicates, and phosphate salts, such as orthophosphate Mixtures of such salts are also effective, for example, a mixture of sodium meta-silicate and sodium orthophosphate which yield a pH of about 12.7 has been found to be very desirable. Alternatively, quaternary ammonium salts of weak acids may be used to provide salts, 5 percent solutions of which have a pH of from 12 to 13.5 in the composition medium. Such quaternary ammonium salts include, among others, trimethyl benzyl ammonium silicates and phosphates. Also silicate and phosphate salts of pyridiniums and quinoliniums may be used.

The oxidizing agent must be one which is active in an alkaline solution. Sodium and potassium permanganate, as well as sodium and potassium ferricyanide, have been found to be effective oxidizing agents in alkaline solutions. The preferred proportions of the permanganates are from 20 to 60g. per liter, while with the ferricyanides the preferred proportions are from 80 to 320g. per liter. However, sodium and potassium bismuthates, vanadates, and chlorites are among the other oxidizing agents which may be used.

While the compositions of the present invention function satisfactorily at a pH range of from 12 to 13.5, best results are achieved at pH's between 12.4 and 13.2. Accordingly, if it is desired to operate within this narrower pH range, small amounts of acid, such as sulfuric acid or phosphoric acid, may be added to the etching composition to reduce the pH to the narrower range.

The method of the present invention appears to be particularly effective in etching thin films of metal from Group VIA, particularly in etching metals from this group having an atomic number of 42 or less; this includes both chromium and molybdenum.

All commercially available positive photoresists appear to be alkaline-developable and generally of the type described in the previously mentioned U.S. Pat. Nos. 3,201,239 and 3,046,120.

While the composition and method of the present invention have been particularly described with respect to positive photoresists, the composition also provides an excellent etchant for metals covered with a negative photoresist pattern. Because the present composition is also less corrosive on negative photoresists than the standard metal etchants formulated with sodium and potassium hydroxides, the need for post-bakes is either eliminated or substantially reduced.

The method and composition of the present invention need not be limited to optical mask formation; it may also be used in etching thin metallic films to form printed circuits or like electrical elements, as well as for graphic and ornamental purposes.

When the developed photoresist is subjected to a limited post-bake of the type previously described, it is preferable that this post-bake be conducted in an ambient which is oxygen-poor, and most preferable that this ambient be oxygen-free, e.g. inert gases including nitrogen and argon or a vacuum.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A composition having a pH of from 12 to 13.5 for photoetching molybdenum or chromium through positive photoresists consisting essentially of:

about 2 percent to 32 percent by weight of an oxidizing agent selected from the group consisting of potassium ferricyanide and potassium permanganate, and an aqueous solution of from 5 to 15 percent by weight of at least one salt selected from the group consisting of sodium, and potassium silicates and phosphates, the dissociation constant of the salt being such that a 5 percent aqueous solution of the salt in the composition medium has a pH range of from 12 to 13.5.

2. The composition of claim 1 wherein said salt comprises a sodium silicate.

3. The composition of claim 1 wherein said salt comprises a sodium phosphate.

4. The composition of claim 1 wherein said salt comprises a mixture of sodium meta-silicate and sodium ortho-phosphate and said oxidizing agent is potassium permanganate.

* * * * *